(12) United States Patent
Matsuo et al.

(10) Patent No.: US 6,974,945 B2
(45) Date of Patent: Dec. 13, 2005

(54) PHOTOSENSOR

(75) Inventors: Hidetaka Matsuo, Kanagawa (JP);
Takao Katayama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 10/377,301

(22) Filed: Feb. 28, 2003

(65) Prior Publication Data
US 2003/0222264 A1    Dec. 4, 2003

(30) Foreign Application Priority Data
Mar. 1, 2002    (JP)    .............................. 2002-055384

(51) Int. Cl.$^7$ ........................................... H01J 40/14
(52) U.S. Cl. ............................. 250/214 R; 250/214.1; 257/80
(58) Field of Search ................... 250/214.1, 214 R; 257/80; 327/514; 372/50.21

(56) References Cited

U.S. PATENT DOCUMENTS

| 3,427,460 | A | * | 2/1969 | Kleinknecht | ................ 257/461 |
| 4,349,906 | A | * | 9/1982 | Scifres et al. | ............ 372/50.21 |
| 4,847,846 | A | * | 7/1989 | Sone et al. | ............. 372/50.21 |

FOREIGN PATENT DOCUMENTS

| JP | 355086174 A | * | 6/1980 | ................. 257/80 |
| JP | 2000-124484 | | 4/2000 | |
| JP | 2001-305976 | | 11/2001 | |

* cited by examiner

*Primary Examiner*—Stephone B. Allen
(74) *Attorney, Agent, or Firm*—Hogan & Hartson, LLP (57) ABSTRACT

A photosensor comprises an emitter that emits light when a forward voltage is applied to a junction between semiconductor regions different in conduction type, wherein the photosensor detects visible light from a current or a voltage from the emitter based on the wavelength of the visible light applied to the emitter.

20 Claims, 10 Drawing Sheets

PHOTOSENSOR

CROSS-REFERENCE TO RELATED APPLICATIONS

This application is based upon and claims the benefit of priority from the prior Japanese Patent Application(s) No(s). 2002-55384, filed on Mar. 1, 2002, the entire contents of which are incorporated herein by reference.

BACKGROUND OF THE INVENTION

1. Field of the Invention

This invention relates to a photosensor.

2. Related Background Art

To detect illuminance of light of the surrounding environment, photodiodes or phototransistors made by using simplex Si (silicon) have been used as detectors. Detectors are often used to detect visible light in the wavelength band approximately from 400 nm to 720 nm and to control devices. For example, detectors are often used in liquid crystal monitors of electric devices such as portable phones, mobile computers, and so forth. In such a device, if the environment is bright for human eyes, the detector detects the illuminance of the ambient visible light, and the electric device automatically controls and darkens the backlight of the liquid crystal to minimize consumption of the battery.

Figure 10:
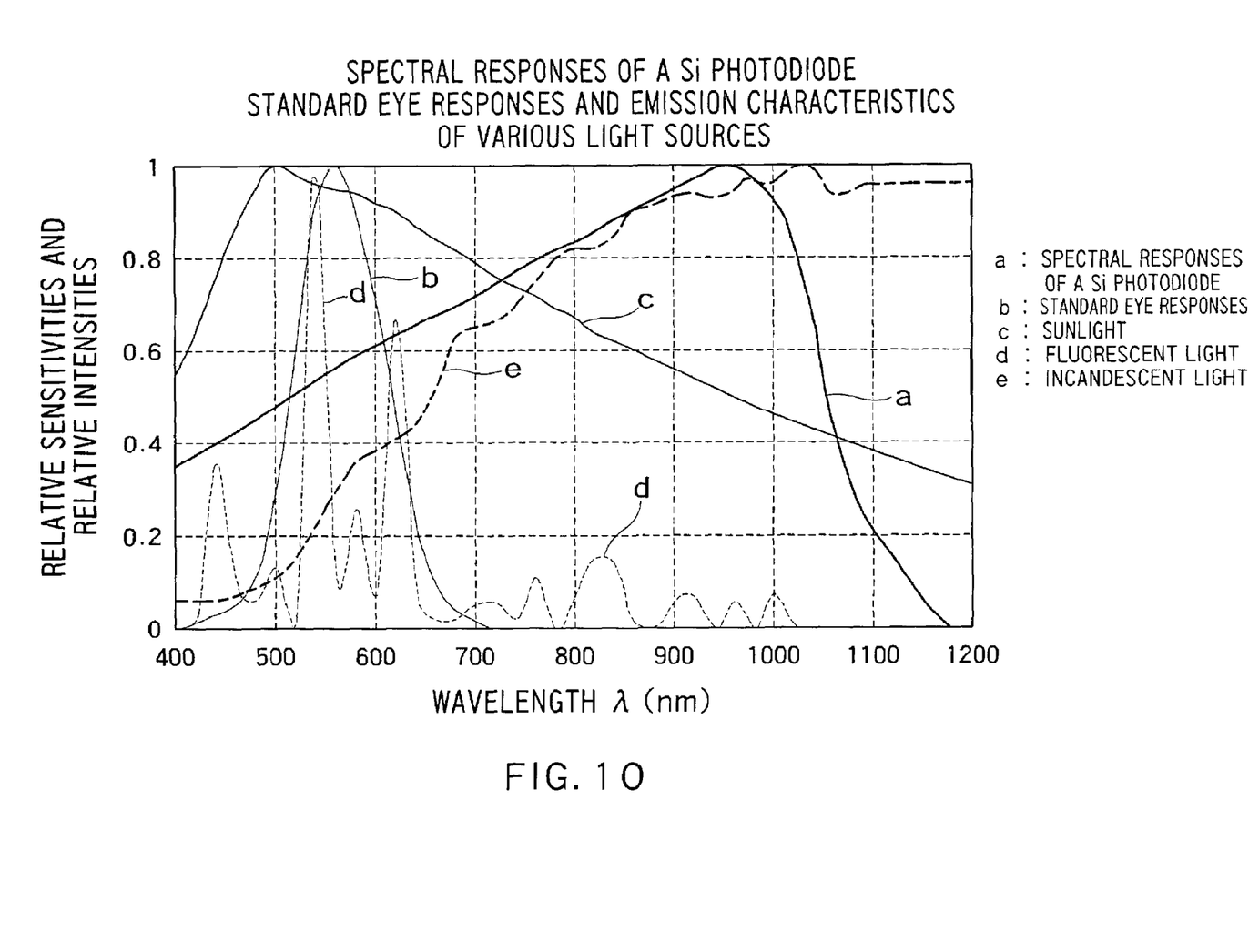
FIG. 10 is a graph showing spectral responses of a Si phototransistor, standard eye responses, and wavelength characteristics of various light sources.

FIG. 10 shows graphs of spectral responses of a Si phototransistor, standard eye responses, and wavelength characteristics of various light sources. The graph a shows spectral responses of a Si-phototransistor, and the graph b shows the standard eye responses. The graphs c, d and e show wavelength characteristics of sunlight, fluorescent light, and incandescent light used as light sources, respectively.

The graphs are shown as relative sensitivities and relative intensities with respect to wavelengths of light waves. Relative sensitivities and relative intensities are ratios of sensitivity values or intensity values relative to maximum values of sensitivities or intensities.

Standard eye responses represent responses of visible light to eyes. For normal human eyes, light having the wavelength around 555 nm is most visible. Therefore, standard eye responses are maximized around 555 nm, and have an extension as shown by the graph b within the wavelength band of visible light approximately from 400 nm to 720 nm.

However, as shown in FIG. 10, sunlight has a small part of its intensity in the infrared band, and light of an incandescent light has a large part of its intensity in the infrared band (see the graphs c and d).

Additionally, in spectral responses of the Si phototransistor, sensitivity to light of the infrared band is maximum (see the graph a). That is, the Si phototransistor has a relatively low spectral response to visible light and a relatively high spectral response to infrared light.

Therefore, even in an environment where the illuminance of visible light is relatively low and it is dark for human eyes, the Si phototransistor may undesirably detect and react on sunlight, or especially infrared light from an incandescent light. This invites malfunctions of the electric device. For example, even when the environment is dark for human eyes, the electric device nevertheless darkens the backlight of its liquid crystal. Therefore, to ensure the detector reacts only on the illuminance by visible light, it is necessary to adjust the spectral responses of the detector nearer to the standard eye responses.

To ensure a Si phototransistor accurately detects the illuminance of visible light exclusively, the existing techniques locate a correction luminous-efficiency filter outside the Si phototransistor. The luminous-efficiency correction filter adjusts the spectral responses of the Si phototransistor (see the graph a) nearer to the standard eye responses (graph b) by correcting the wavelength of light entering into the Si phototransistor.

However, the use of the luminous-efficiency correction filter inevitably increases the size of the detector and needs a larger area or space for surfacing the detector in the electric device.

Moreover, the use of the luminous-efficiency correction filter increases the cost of the detector and the electric device.

It is therefore desirable to realize a photosensor having spectral responses closer to standard eye responses without the need of a luminous-efficiency correction filter.

SUMMARY OF THE INVENTION

A photosensor according to an embodiment of the invention comprises emitter that emits light when a forward voltage is applied to a junction between semiconductor regions different in conduction type, wherein the photosensor detects visible light from a current or a voltage from the emitter based on the wavelength of the visible light applied to the emitter.

DETAILED DESCRIPTION OF THE INVENTION

Some embodiments of the invention will now be explained below with reference to the drawings. The embodiments, however, should not be construed to limit the invention.

Figure 1:
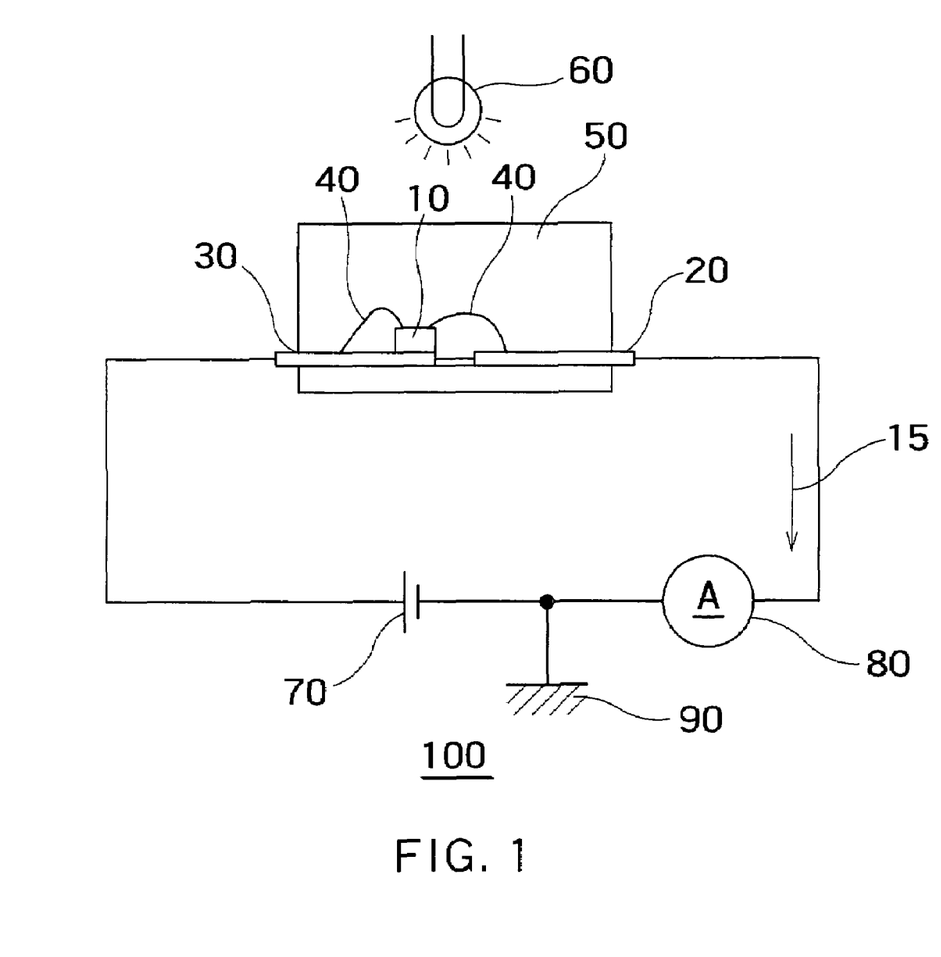
FIG. 1 is a schematic circuit diagram of a photosensor 100 according to the first embodiment of the invention.

FIG. 1 is a schematic circuit diagram of a photosensor 100 according to the first embodiment of the invention. The photosensor 100 includes emitter (hereinafter also called LED (light emitting diode)) that emits light when a forward voltage is applied to a pn junction between an n-type semiconductor and a p-type semiconductor. The photosensor 100 further includes an anode terminal 20 and a cathode terminal 30. The emitter 10 has an anode electrode and a cathode electrode that are electrically connected to the anode terminal 20 and the cathode terminal 30, respectively, by bonding wires 40. The anode terminal 20 and the cathode terminal 30 are connected to a voltage source 70. A current detector is provided between the anode terminal 20 and the cathode terminal 30. The anode terminal 20 is connected to the ground potential. The emitter 10 is molded with a transparent resin 50.

Explained below are operations of this photosensor 100.

Emitters, in general, emit light when electrons injected by a forward voltage applied in the forward direction of a pn junction combine with holes, or when holes injected by a forward voltage combine with electrons. That is, the emitter 10 emits light when a higher voltage than that of the cathode terminal 30 is applied to the anode terminal 20.

In this embodiment, however, the voltage source 70 is electrically connected to the emitter 10 to apply a voltage in the reverse direction of the pn junction. That is, the voltage source 70 applies a higher voltage than that of the anode terminal 20 to the cathode terminal 30. In this embodiment, therefore, the inverted voltage applied to the pn junction of the emitter 10 generates a depletion layer from the on junction. Then, when light applied to the emitter from the light source 60 enters the depletion layer, it generates electrons and holes. Responsively, an output current 15 flows in the photosensor 100 in the arrow-marked direction. Therefore, a current detector 80 can detect the output current 15.

In this manner, the embodiment of the invention is used as a sensor for detecting light without emission of light by the emitter 10.

Figure 2:
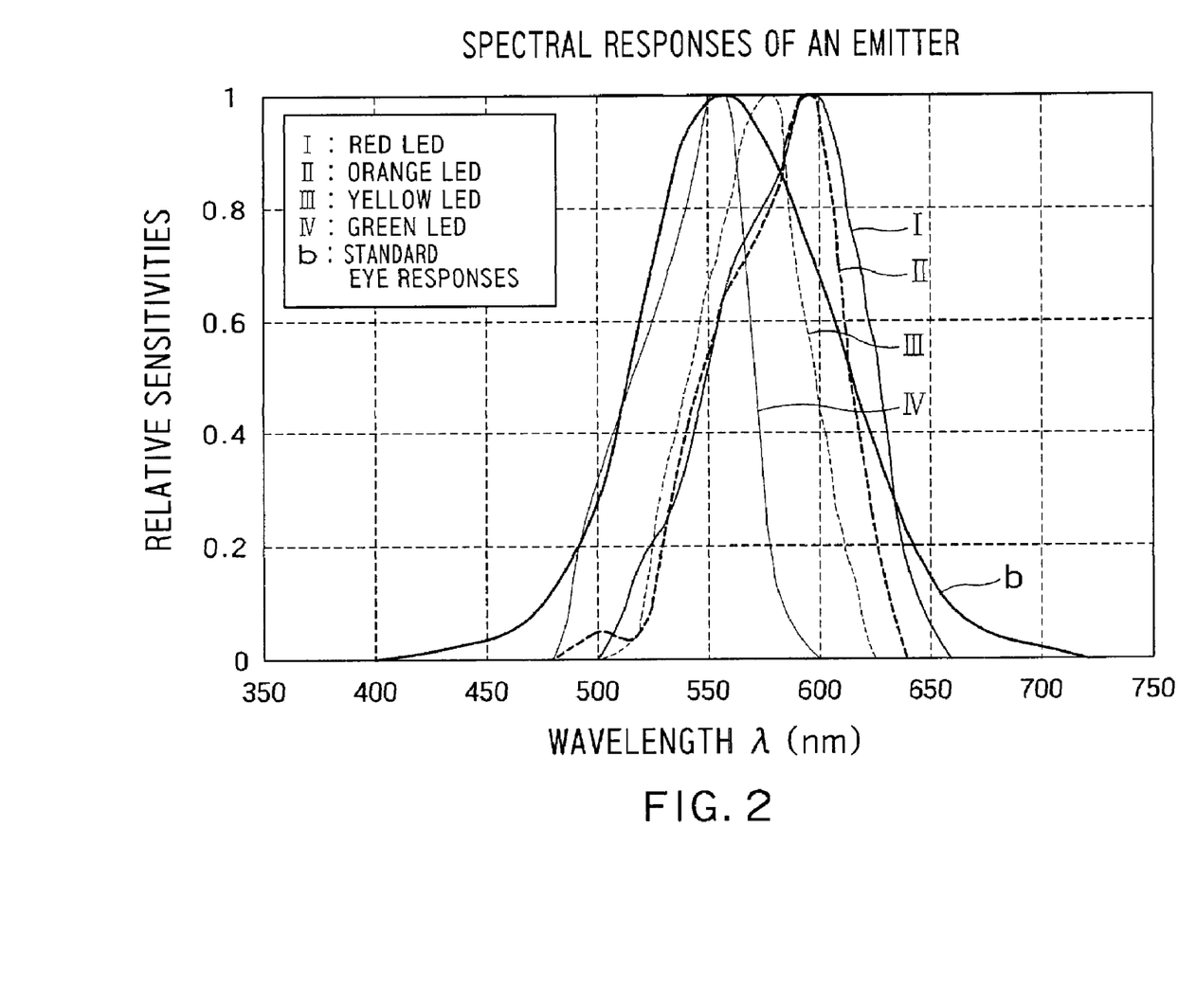
FIG. 2 is a graph showing spectral responses and standard eye responses obtained when a emitter is used in a photosensor.

FIG. 2 is a graph showing spectral responses and standard eye responses obtained when an emitter is used in a photosensor. The graphs I, II, III and IV show spectral responses obtained when emitters for emitting red, orange, yellow and green light, respectively, are used in a photosensor. Similarly to FIG. 10, the graph b shows the standard eye responses.

The red LED (graph I) and orange LED (graph II) are apparently offset from the standard eye responses as compared with the yellow LED (graph III) and the green LED (graph IV). It is appreciated from FIG. 2 that the yellow LED (graph III) or the green LED (graph IV) is the emitter exhibiting spectral responses closest to the standard eye responses. The emitter preferably has enough spectral response to detect optical waves of wavelengths in the range approximately from 500 nm to 620 nm excluding the trail portion of the graph b. Thus the emitter exhibits spectral response suitable for standard eye responses of most average persons, and does not have excessively wide spectral response.

Next made is a review to discover which of the yellow LED and the green LED is more adequate as the emitter to be used in the photosensor.

Figure 3:
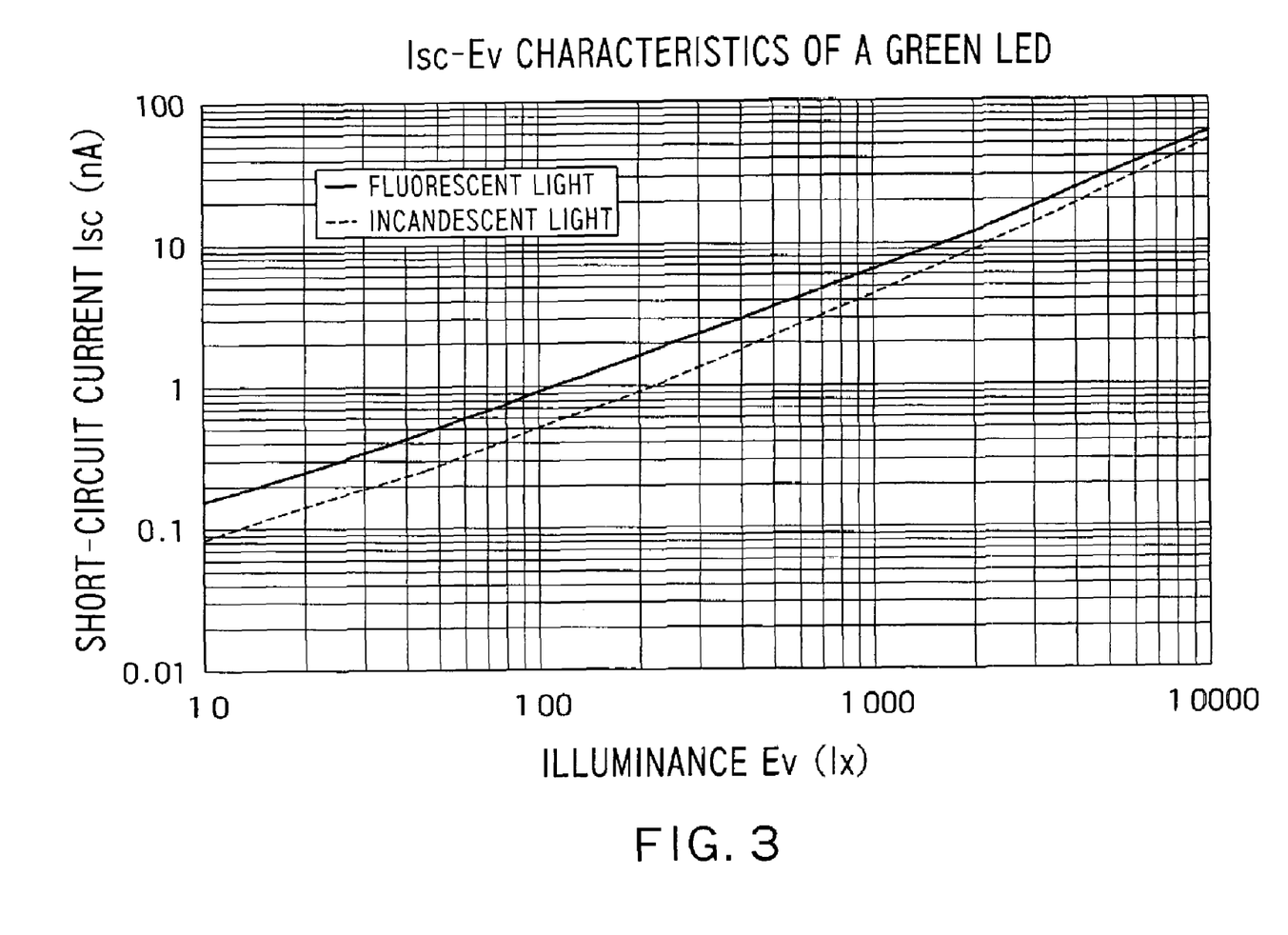
FIG. 3 is a graph showing output current I5 (short-circuit current Isc) relative to illuminance Ev of visible light obtained when a green LED is used in a photosensor 100.

FIG. 3 is a graph showing output current 15 (short-circuit current Isc) relative to illuminance Ev of visible light obtained when a green LED is used in a photosensor 100.

Figure 4:
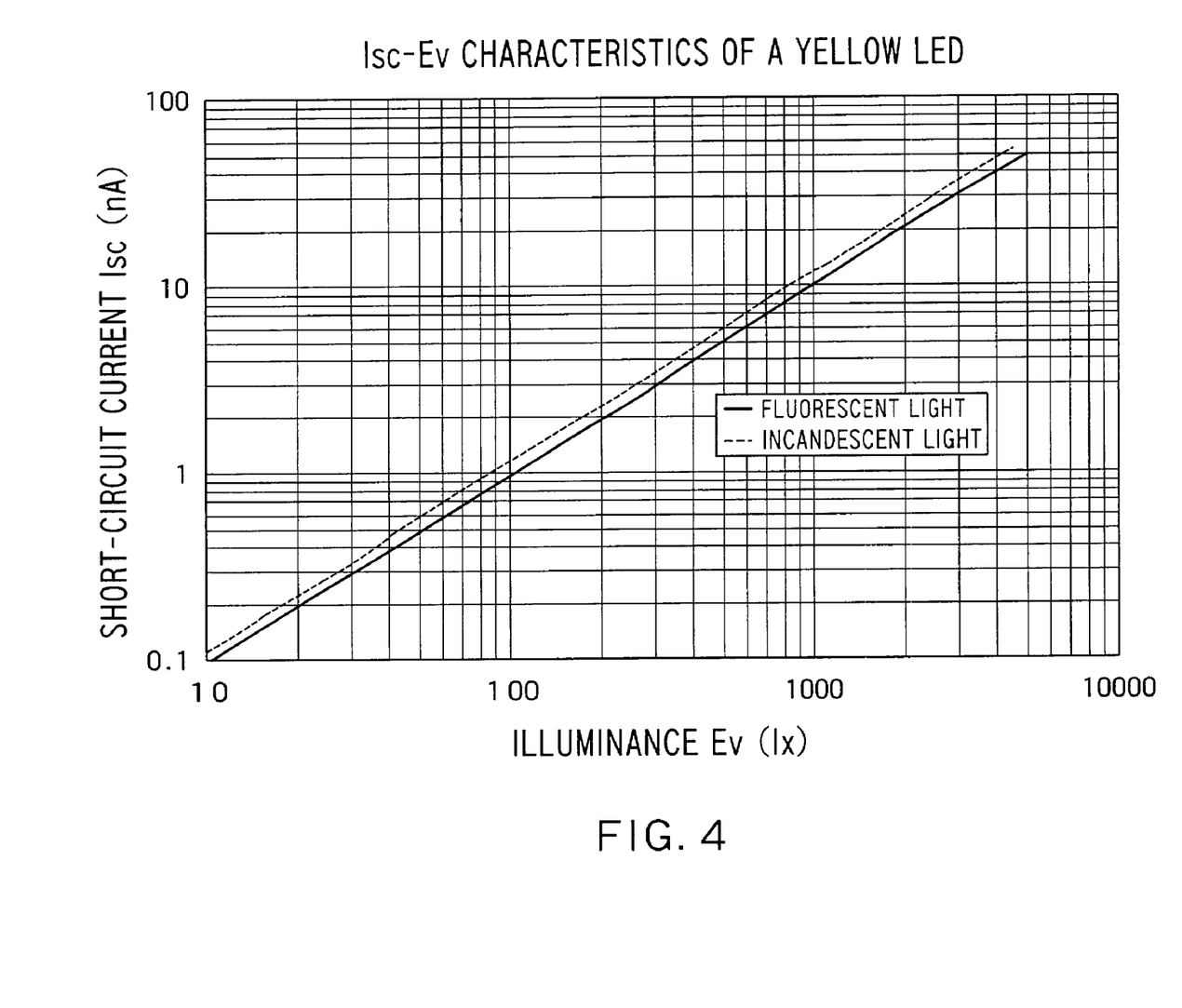
FIG. 4 is a graph showing output current I5 (short-circuit current Isc) relative to illuminance Ev of visible light obtained when a yellow LED is used in a photosensor 100.

FIG. 4 is a graph showing output current 15 (short-circuit current Isc) relative to illuminance Ev of visible light obtained when a yellow LED is used in a photosensor 100.

FIG. 3 and FIG. 4 each show a graph obtained upon using a fluorescent light as the light source by a solid line and a graph obtained upon using an incandescent light as the light source by a broken line. In each of FIGS. 3 and 4, the abscissa represents illuminance Ev of visible light in the unit of lux (lx) whereas the ordinate represents short-circuit current Isc from the emitter 10 in the unit of nanoampere (nA).

The reason why the fluorescent light and the incandescent light are selected as light sources lies in that, as shown in FIG. 10, the fluorescent light emits light substantially only in the band of visible light whereas the incandescent light emits light relatively weak in the visible band and relatively intensive in the infrared band, that is, because the fluorescent light and the incandescent light are largely different in wavelength band of the highest emission intensity or in emission spectrum.

By comparing graphs of the short-circuit current Isc relative to the illuminance Ev of visible light obtained by using light sources largely different in wavelength band of the highest emission intensity or in light emission spectrum, it can be determined whether the emitter 10 reacts exclusively on visible light or not.

As shown in FIG. 4, the photosensor using the yellow LED outputs a substantially constant short-circuit current Isc relative to a constant illuminance Ev of visible light whether the fluorescent light or the incandescent light is used as its light source. The yellow LED emits light in the range approximately from 530 nm to 590 nm. In contrast, as shown in FIG. 3, in the photosensor using the green LED, different short-circuit currents Isc are output between the fluorescent light and the incandescent light even when the illuminance Ev of visible light is constant.

It is therefore appreciated that the photosensor using the yellow LED reacts almost exclusively on visible light. In other words, the yellow LED is less affected by light in the infrared band than the green LED. Therefore, it has been confirmed that the yellow LED is more suitable than the green LED for detecting illuminance of visible light.

Possible materials of the active layer of the yellow LED are InGaAlP, GaAsP, GaP, and the like. However, InGaAlP, which is large in emission output, i.e. short-circuit current Isc, is preferable.

Figure 5:
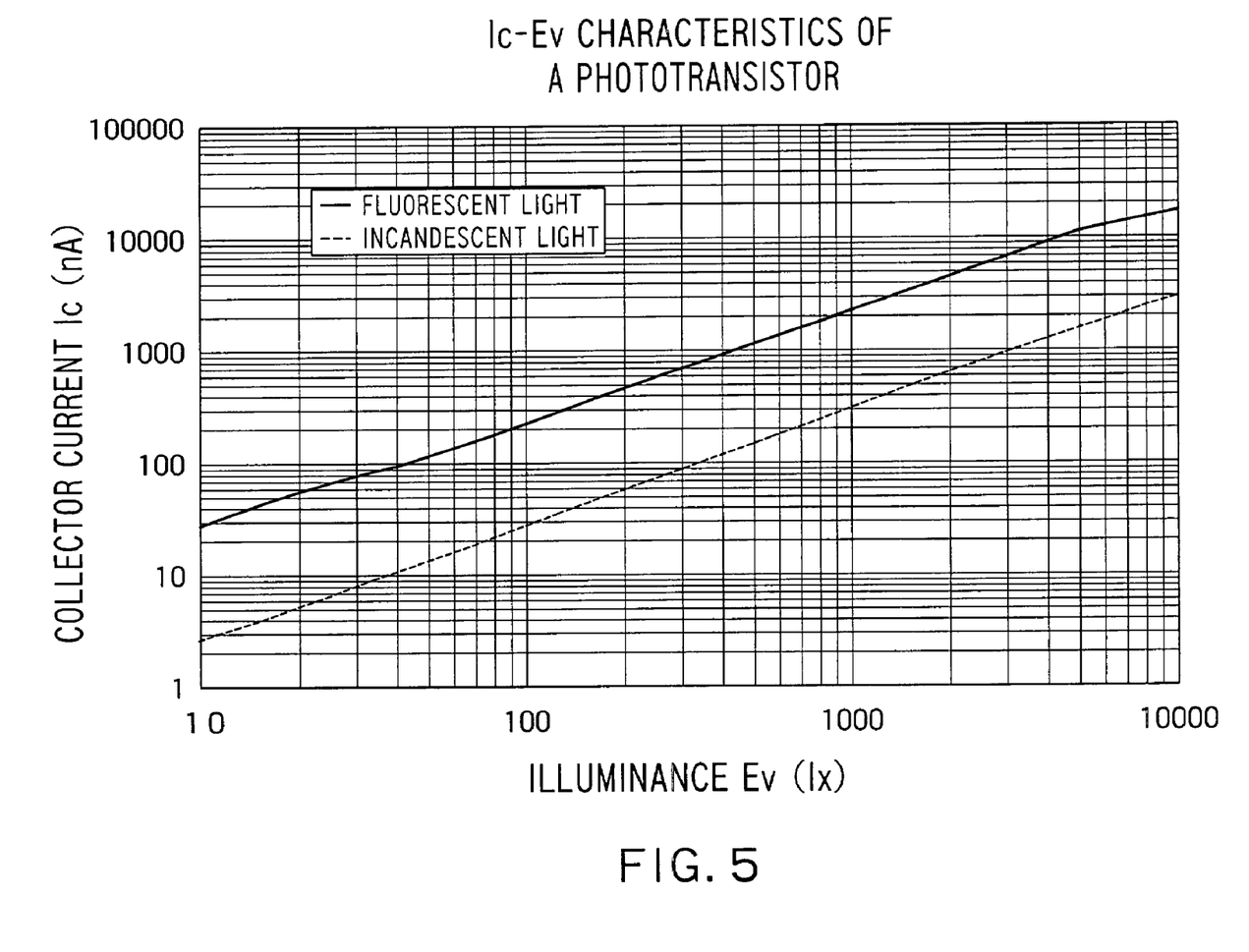
FIG. 5 is a graph showing collector current Ic relative to illuminance Ev of visible light in an existing photosensor using a Si phototransistor.

FIG. 5 is a graph showing collector current Ic relative to illuminance Ev of visible light in an existing photosensor using a Si phototransistor.

With reference to FIGS. 3, 4 and 5, effects of the instant embodiment will be explained below.

When the illuminance Ev of visible light is 100 lx, for example, the difference in collector current Ic between a fluorescent light and an incandescent light is approximately 200 nA in the existing photosensor. In contrast, in the photosensor 100 using the yellow LED according to the instant embodiment, the difference in short-circuit current Isc between the fluorescent lamp and the incandescent lamp is approximately 0.1 nA. In the photosensor 100 using the green LED according to the instant embodiment, the difference in short-circuit current Isc between the fluorescent light and the incandescent light is approximately 0.4 nA.

As reviewed above, in the photosensor 100 according to the instant embodiment, the difference in short-circuit current Isc between the fluorescent light and the incandescent light is very small. Therefore, the photosensor 100 according to the instant embodiment is least affected by light in the infrared band, and reacts substantially only on visible light.

That is, the spectral responses of the emitter 10 of the photosensor 100 are very close to the standard eye responses.

Therefore, the photosensor 100 needs no luminous-efficiency correction filter and can be downsized thereby to reduce the area required for its packaging in an electric device.

In addition, since the photosensor 100 needs no luminous-efficiency correction filter, it contributes to reducing the cost of the photosensor 100 itself and the cost of the electric device using the photosensor 100.

Figure 6:
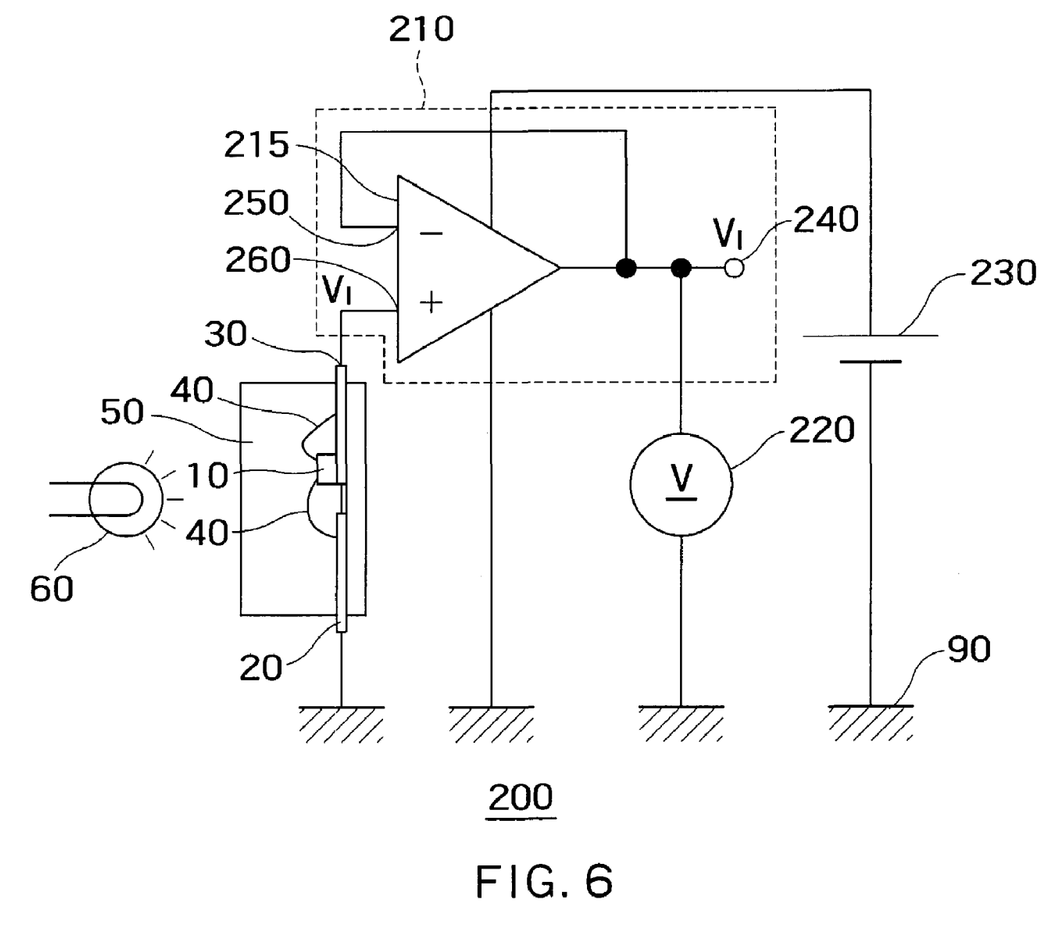
FIG. 6 is a schematic circuit diagram of a photosensor 200 according to the second embodiment of the invention.

FIG. 6 is a schematic circuit diagram of a photosensor 200 according to the second embodiment of the invention, in which identical or equivalent components to those of the first embodiment are labeled with common reference numerals. Similarly to the first embodiment, the emitter 10 in this embodiment is a yellow LED having spectral responses closer to standard eye responses. Material of the active layer of this yellow LED may be InGaAlP, GaAsP, GaP, and so on. The material is preferably InGaAlP to ensure a relatively large emission output, i.e. a relatively large short-circuit current Isc.

The photosensor 200 additionally includes a voltage follower circuit 210 that outputs a signal which is input from the cathode electrode 30 of the emitter 10 and is converted in impedance.

The voltage follower circuit 210 includes an operational amplifier such as a CMOS operational amplifier 215. Output 240 of the CMOS operational amplifier 215 is connected to an inverted input terminal 250 of the CMOS operational amplifier 215 to form a negative feedback configuration. The inverted input terminal 250 of the CMOS operational amplifier 215 is not connected to the ground potential, and no resistor is connected between the output 240 and the inverted input terminal 250. Therefore, voltage Vi of the non-inverted input terminal 260 of the CMOS operational amplifier 215 is output from the output 240 without being amplified.

Note that the voltage source 230 is connected to the CMOS operational amplifier 215 and a voltage detector 220 is connected to the output 240 of the CMOS operational amplifier 215.

Additionally, in the voltage follower circuit 210, input impedance of the non-inverted input terminal 260 is very high whereas output impedance of the output 240 is very low. That is, the voltage follower circuit 210 is used for impedance conversion.

The anode electrode 20 of the emitter 10 is connected to the ground potential as its reference voltage. That is, the emitter 10 is in the open condition with no voltage applied.

Operations of the photosensor 200 will be explained below.

When light from the light source 60 enters into the emitter 10 through the transparent resin 50, an electromotive voltage Voc is generated in the emitter 10 which is in the open condition. The electromotive voltage Voc is input to the non-inverted input terminal 260 with a high input impedance, then converted to a lower impedance by the voltage follower circuit 210, and thereafter output in form of the electromotive voltage $V_{OC}$ from the output 240.

The voltage detector 220 detects this electromotive voltage VOC from the output 240.

Figure 7:
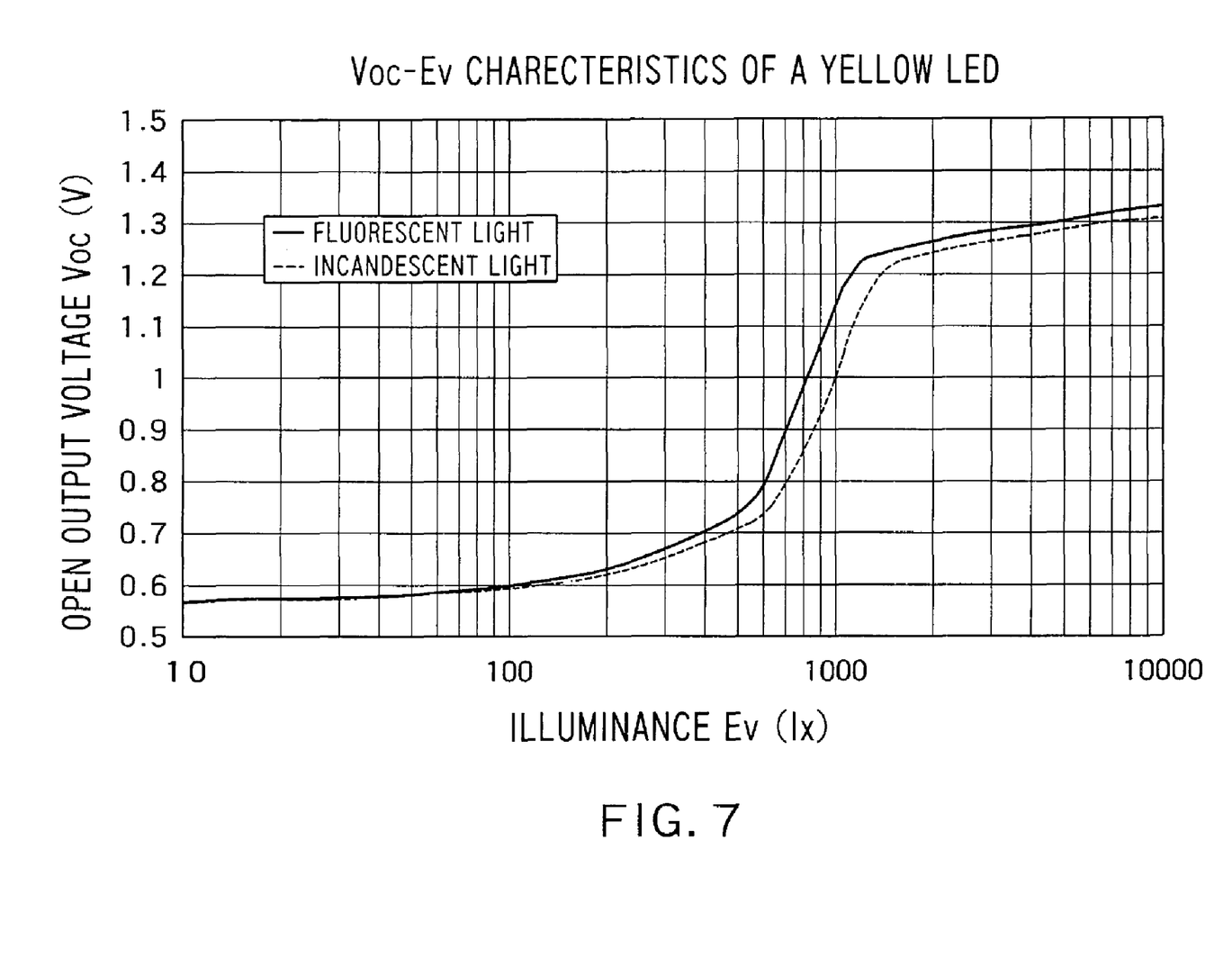
FIG. 7 is a graph showing electromotive voltage Voc relative to illuminance Ev of visible light in the photosensor 200 according to the second embodiment.

FIG. 7 is a graph showing electromotive voltage Voc relative to illuminance Ev of visible light in the photosensor 200 according to the second embodiment. The graph shown with the solid line is that obtained upon using a fluorescent light as the light source and the graph shown with the broken line is that obtained upon using an incandescent light as the light source. The abscissa represents illuminance Ev of visible light in the unit of lux (lx), and the ordinate represents the electromotive voltage Voc from the emitter 10 in the unit of volt (V).

Figure 8:
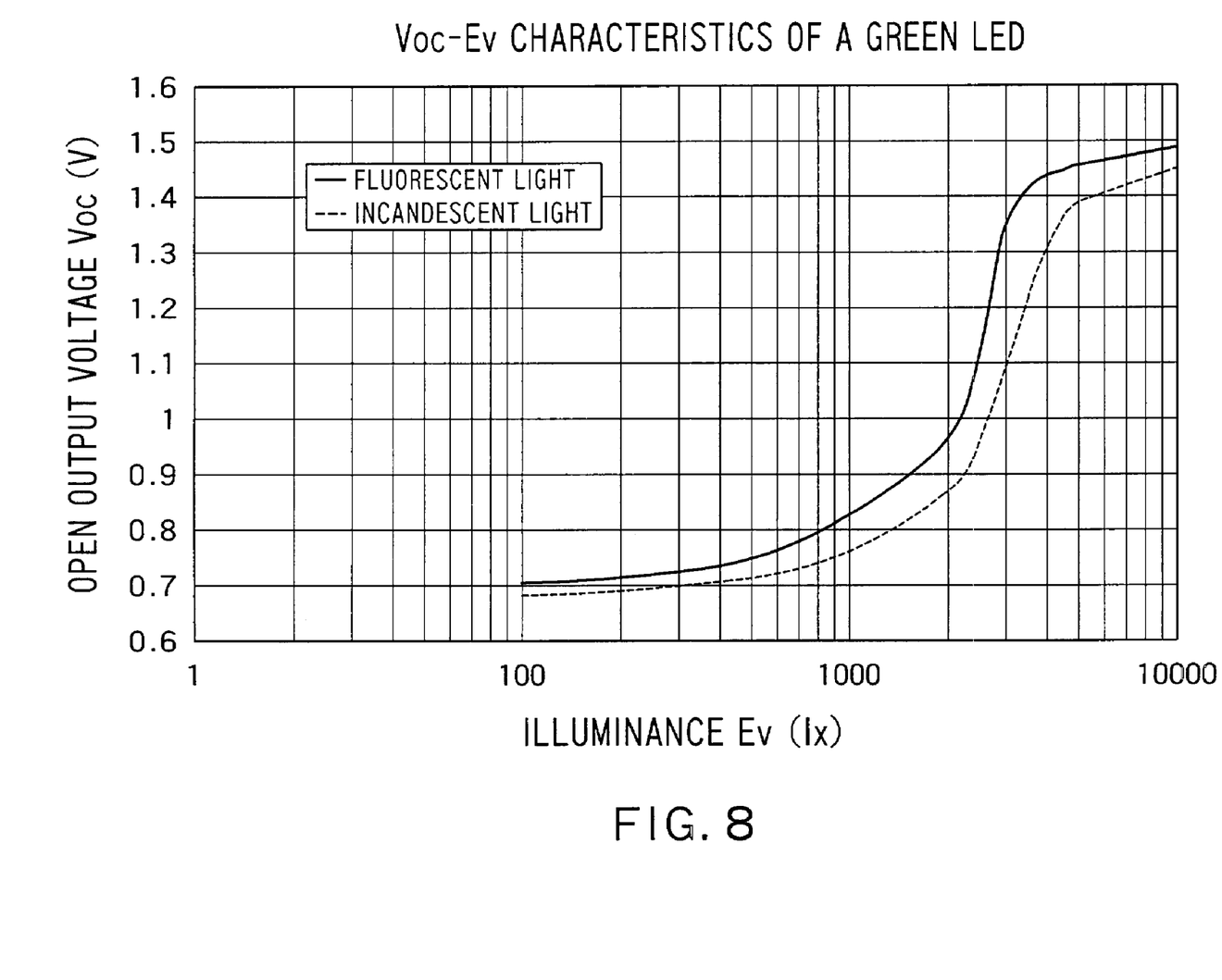
FIG. 8 is a graph showing electromotive voltage Voc relative to illuminance Ev of visible light in the photosensor 200 using a green LED instead of a yellow LED.

FIG. 8 is a graph showing electromotive voltage Voc relative to illuminance Ev of visible light in the photosensor 200 using a green LED instead of a yellow LED. Here again, the abscissa and the ordinate represent the same materials shown in FIG. 7.

In comparison between FIG. 7 and FIG. 8, the difference in electromotive voltage Voc between the fluorescent light and the incandescent light is smaller when using the yellow LED than the green LED. That is, spectral responses of the photosensor 200 using the yellow LED are closer to the standard eye responses than the spectral responses of the photosensor 200 using the green LED. Therefore, here again in the instant embodiment, the use of the yellow LED as the emitter 10 is more preferable than the use of the green LED.

The spectral responses of the photosensor 200 according to the instant embodiment are closer to the standard eye responses than the spectral responses of the existing Si phototransistor. Therefore, the photosensor 200 shown here has effects equivalent to those of the photosensor 100 according to the first embodiment.

Figure 9:
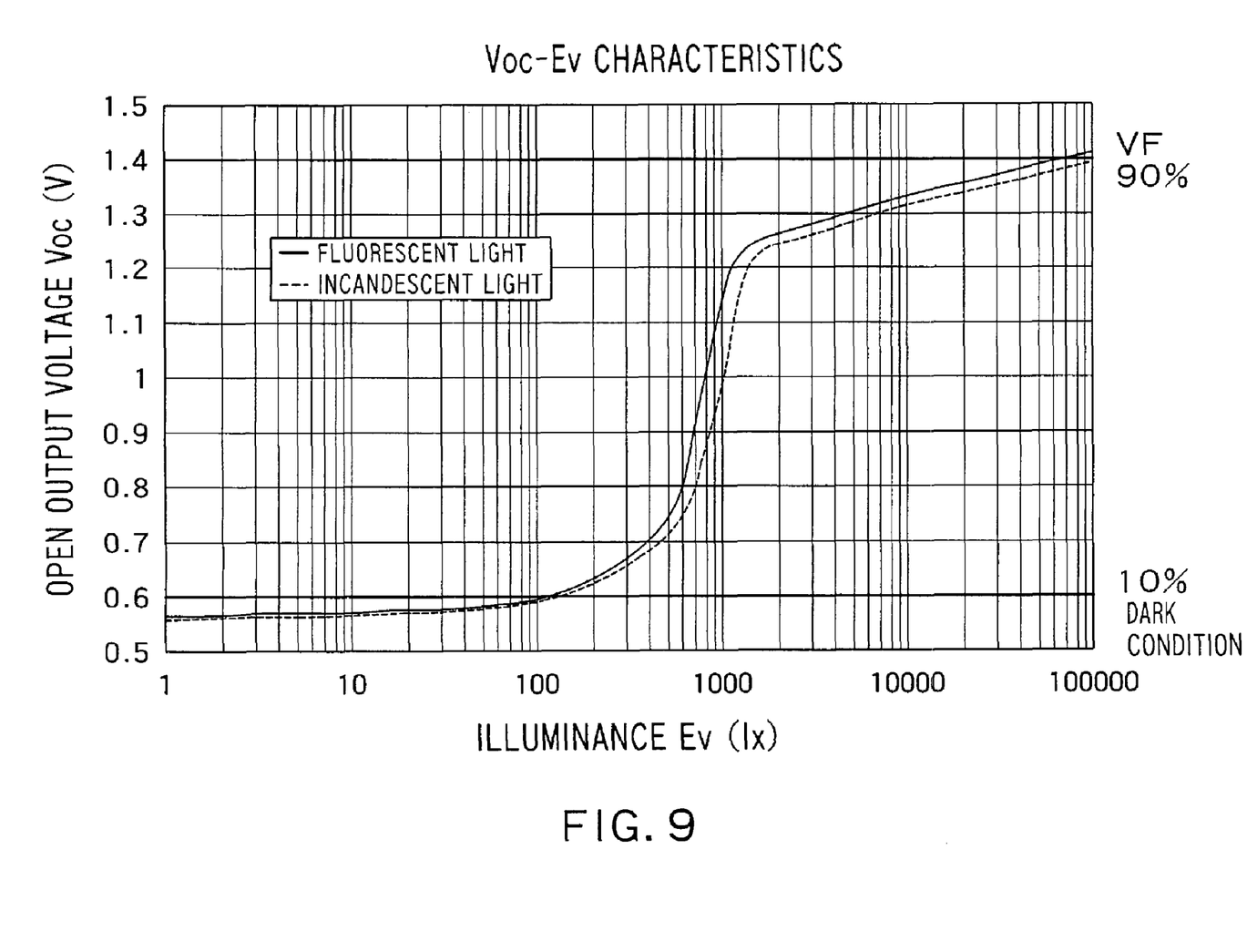
FIG. 9 is a graph showing electromotive voltage Voc relative to illuminance Ev of visible light in the photosensor 200.

FIG. 9 is a graph, similar to that of FIG. 7, which shows electromotive voltage Voc relative to illuminance Ev of visible light in the photosensor 200. Effects of the photosensor 200 according to the same embodiment will be explained below in greater detail with reference to FIG. 9.

LEDs in general emit light in response to a forward voltage in a predetermined range. The range of possible voltage values of the forward voltage for emission of a LED is named "the emission voltage range". On the other hand, when visible light is applied to the same LED, the LED outputs an electromotive voltage Voc. The range of possible values of the electromotive voltage Voc is named "the open output voltage range". Usually, extension of the emission voltage range and extension of the open output voltage range are approximately equal. Therefore, the emission voltage range and the open output voltage range may be called "the forward voltage range".

For example, the yellow LED used in this embodiment has an emission voltage range with an extension of approximately 1.0 Volt. Therefore, when visible light is applied, the yellow LED has an open output voltage range with the extension of approximately 1.0 Volt. Then, the reason why the actual electromotive voltage Voc may be a voltage in the range of open output voltages approximately from 0.5 V to 1.5 V lies in that the offset voltage of the CMOS operational amplifier 215 is approximately 0.5 V. That is, when the surrounding environment is sufficiently dark, the electromotive voltage Voc is approximately 0.5 V. In case the surrounding environment is sufficiently bright, the electromotive voltage Voc is approximately 1.5 V.

According to the instant embodiment, inclination of the electromotive voltage Voc is relatively larger in the range approximately from 10% to 90% of the emission voltage range or open output voltage range. That is, the electromotive voltage Voc largely changes with illuminance Ev of the visible light. This means that the photosensor 200 according to the instant embodiment can detect the illuminance Ev with a high degree of accuracy.

Additionally, the illuminance Ev linearly changes approximately between 100 lx to 1500 lx and approximately between 1500 lx to 100000 lx. Therefore, precise illuminance Ev for a certain electromotive voltage Voc can be derived easily. The graph is smaller in inclination in the range approximately from 1500 lx to 100000 lx than in the range approximately from 100 lx to 1500 lx. However, the photosensor 200 can accomplish sufficient detection of illuminance in the range approximately from 1500 lx to 100000 lx. Additionally, illuminance approximately ranging from 100 lx to 1500 lx contains a sufficient range of illuminance under typical environments (such as in rooms), and illuminance in the range approximately from 1500 lx to 100000 lx corresponds to the illuminance under special environments (such as outdoors under the flaming sun). Therefore, the photosensor 200 usually need not detect the illuminance in the range approximately from 1500 lx to 100000 lx. Note here that, in FIG. 9, the graph of the range approximately from 100 lx to 1500 lx appears as a curve; however, since the abscissa is shown in logarithm, the curve in this range is actually linear.

Thus the photosensor according to the instant embodiment can precisely detect illuminance Ev with a high degree of accuracy in the range approximately from 10% to 90% of the emission voltage range or the open output voltage range.

The detection accuracy of incident light decreases under illuminance Ev of and below 100 lx. However, illuminance Ev of illumination in locations of daily life and for daily activities is normally not lower than 100 lx and not higher than approximately 100000 lx. Therefore, the illuminance range where the illuminance Ev linearly changes will be suitable for human living.

In the instant embodiment, the voltage follower circuit 210 may be incorporated in a single chip together with the emitter 10 and other components molded by the transparent resin 50. This will contribute to further downsizing the photosensor and reducing its cost.

Since the photosensor according to the instant embodiment has spectral responses closer to the standard eye responses because of the use of an emitter as the detector, it needs no luminous-efficiency correction filter. The photosensor using no luminous-efficiency correction filter can be downsized, and reduces its area for packaging in an electric device.

The photosensor omitting the luminous-efficiency correction filter according to the instant embodiment contributes to reduce its cost and the cost of the electric device using the photosensor.

What is claimed is:

1. A photosensor comprising:
   an emitter that emits light when a forward voltage is applied to a junction between semiconductor regions different in conduction type,
   wherein the photosensor detects visible light from a current or a voltage from the emitter based on the wavelength of the visible light applied to the emitter,
   wherein the emitter emits light in a range of approximately 530 nm to 590 nm.

2. The photosensor according to claim 1, wherein the emitter detects illuminance.

3. The photosensor according to claim 1 further comprising a voltage source which is electrically connected to the emitter and which supply voltage to said junction in the reverse direction, and wherein the photosensor detects visible light by a current which is generated from the emitter based on the wavelength of the visible light applied to the emitter.

4. The photosensor according to claim 1, wherein the photosensor detects visible light by an electromotive voltage which is generated in the emitter based on the wavelength of visible light applied to the emitter.

5. The photosensor according to claim 4, wherein one of electrodes of the emitter is connected to a reference voltage,
   wherein the photosensor further comprises an operational amplifier which includes a non-inverted input connected to the other electrode of the emitter, and an inverted input and an output connected together, thereby to output the electromotive voltage in a converted form with a lower impedance than the input impedance, and
   wherein the photosensor detects the visible light from the electromotive voltage output from the operational amplifier.

6. The photosensor according to claim 4, wherein the electromotive voltage changes substantially linearly with wavelength of the visible light when the value of the electromotive voltage falls in the range from 10% to 90% of the emission voltage range or the open output voltage range.

7. The photosensor according to claim 6 wherein, the electromotive voltage changes with a first inclination in the range of illuminance from 100 lux to 1500 lux.

8. The photosensor according to claim 7, wherein the electromotive voltage changes with a second inclination in the range of illuminance from 1500 lux to 100000 lux.

9. The photosensor according to claim 4, wherein the electromotive voltage exhibits a larger rate of change with wavelength of visible light when the electromotive voltage is in the range from 10% to 90% of the emission voltage range or the open output voltage range than when it is in the other range.

10. The photosensor according to claim 1, wherein the emitter has spectral responses close to standard eye responses.

11. The photosensor according to claim 1, wherein the emitter detects optical waves in the range of wavelengths from 500 nm to 620 nm.

12. The photosensor according to claim 1, wherein the emitter emits from yellow light to green light.

13. The photosensor according to claim 1, wherein semiconductors of the emitter are made of a material selected from InGaAlP, GaAsP and GaP.

14. A photosensor comprising:
   an emitter that emits light when a forward voltage is applied to a junction between semiconductor regions different in conduction type, one of electrodes of the emitter being connected to a reference voltage, and
   an operational amplifier which includes a non-inverted input connected to the other electrode of the emitter, and an inverted input and an output connected together, thereby to output the electromotive voltage in a converted form with a lower impedance than the input impedance,
   wherein the photosensor detects visible light by an electromotive voltage which is generated in the emitter based on the wavelength of visible light applied to the emitter and which is output from the operational amplifier.

15. The photosensor according to claim 14, wherein the emitter emits light in a range of approximately 530 nm to 590 nm.

16. A photosensor comprising:
   an emitter that emits light when a forward voltage is applied to a junction between semiconductor regions different in conduction type, wherein the photosensor detects visible light by an electromotive voltage which is generated in the emitter based on the wavelength of visible light applied to the emitter, wherein the electromotive voltage exhibits a larger rate of change with wavelength of visible light when the electromotive voltage is in the range from 10% to 90% of the emission voltage range or the open output voltage range that when it is in the other range.

17. The photosensor according to claim 16, wherein the electromotive voltage changes substantially linearly with wavelength of the visible light when the value of the electromotive voltage fails in the range from 10% to 90% of the emission voltage range or the open output voltage range.

18. The photosensor according to claim 17, wherein the electromotive voltage changes with a first inclination in the range of illuminance from 100 lux to 1500 lux.

19. The photosensor according to claim 18, wherein the electromotive voltage changes with a second inclination in the range of illuminance from 1500 lux to 100000 lux.

20. The photosensor according to claim 17, wherein the emitter emits light in a range of approximately 530 nm to 590 nm.

* * * * *